US009761815B2

(12) United States Patent
Liu et al.

(10) Patent No.: US 9,761,815 B2
(45) Date of Patent: Sep. 12, 2017

(54) FLEXIBLE SUBSTRATE, OLED DEVICE AND DEFECT DETECTING METHOD FOR THE SAME

(71) Applicant: BOE TECHNOLOGY GROUP CO., LTD., Beijing (CN)

(72) Inventors: Lu Liu, Beijing (CN); Mingzhe Xie, Beijing (CN); Wei Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 95 days.

(21) Appl. No.: 14/443,537

(22) PCT Filed: Nov. 11, 2014

(86) PCT No.: PCT/CN2014/090800
§ 371 (c)(1),
(2) Date: May 18, 2015

(87) PCT Pub. No.: WO2015/165244
PCT Pub. Date: May 11, 2015

(65) Prior Publication Data
US 2016/0285017 A1     Sep. 29, 2016

(30) Foreign Application Priority Data
Apr. 29, 2014    (CN) .......................... 2014 1 0178311

(51) Int. Cl.
*B32B 27/32*    (2006.01)
*G01B 11/16*    (2006.01)
(Continued)

(52) U.S. Cl.
CPC .......... *H01L 51/0097* (2013.01); *C23C 16/44* (2013.01); *G01B 11/30* (2013.01);
(Continued)

(58) Field of Classification Search
USPC .......................................................... 73/762
See application file for complete search history.

(56) References Cited

U.S. PATENT DOCUMENTS 5,490,426 A * 2/1996 Shiga .................... G01L 5/0047
73/762
6,268,695 B1    7/2001 Affinito
(Continued)

FOREIGN PATENT DOCUMENTS

EP    2597697 A1    5/2013

OTHER PUBLICATIONS

Carpi et al. ("Colours from electroactive polymers: Electrochromic, electroluminescent and laser devices based on organic materials," Optics & Laser Technology 38 (2006) 292-305).*
(Continued)

*Primary Examiner* — David Sample
*Assistant Examiner* — Nicole T Gugliotta
(74) *Attorney, Agent, or Firm* — Nath, Goldberg & Meyer; Joshua B. Goldberg

(57) ABSTRACT

The present invention relates to the field of display technology, and particularly provides a flexible substrate, an OLED device including the flexible substrate and a defect detecting method for the same. The flexible substrate comprises a bottom plate and a barrier layer arranged above the bottom plate, wherein the flexible substrate further comprises a crack detection layer, which is arranged adjacent to the barrier layer; the crack detection layer produces a crack when the barrier layer produces a crack; and the color of the crack detection layer with a crack is different from that of the crack detection layer without a crack in a power-on state. The flexible substrate and the OLED device have relatively high detection efficiency, and can ensure the accuracy of
(Continued)

detection, so that the rate of qualified products of the flexible substrate and the OLED device are improved.

20 Claims, 3 Drawing Sheets

(51) Int. Cl.
H01L 51/00 (2006.01)
H01L 51/52 (2006.01)
C23C 16/44 (2006.01)
G01B 11/30 (2006.01)

(52) U.S. Cl.
CPC .......... *H01L 51/0031* (2013.01); *H01L 51/52* (2013.01); *H01L 51/5253* (2013.01); *H01L 2251/5338* (2013.01); *Y02E 10/549* (2013.01)

(56) References Cited

U.S. PATENT DOCUMENTS

| | | | | |
|---|---|---|---|---|
| 6,499,355 B1 * | 12/2002 | Potyrailo | ............... | G01B 11/20 73/150 A |
| 6,949,825 B1 * | 9/2005 | Guenther | .............. | H01L 51/524 257/684 |
| 2015/0036299 A1 * | 2/2015 | Namkung | ......... | G02F 1/133345 361/749 |

OTHER PUBLICATIONS

European Search Report dated Nov. 30, 2016 in corresponding European Application No. EP14861124.

\* cited by examiner

FLEXIBLE SUBSTRATE, OLED DEVICE AND DEFECT DETECTING METHOD FOR THE SAME

This is a National Phase Application filed under 35 U.S.C. 371 as a national stage of PCT/CN2014/090800, filed Nov. 11, 2014, and claims priority benefit from Chinese Application No. 201410178311.7, filed Apr. 29, 2014, the content of each of which is hereby incorporated by reference in its entirety.

FIELD OF THE INVENTION

The present invention relates to the field of display technology, and particularly relates to a flexible substrate, an OLED device and a defect detecting method for the same.

BACKGROUND OF THE INVENTION

An organic light-emitting diode (OLED) device has attracted attention and research from more and more researchers due to its multiple advantages of low manufacturing cost, full-solid state, active light emission, high brightness, high contrast, being low-voltage direct current driven, low power consumption, wide viewing angle, high response speed, small thickness, wide range of operating temperatures, being capable of implementing flexible display and the like. Especially, due to the characteristic of flexible display, the OLED device can be bent and thus is widely applied in fields needing curved-surface display, such as smart cards, electronic paper, smart labels and the like, and is gradually becoming a new favorite in the field of display technology.

Generally, an OLED device at least includes an anode, a cathode and a luminous layer between the anode and the cathode, wherein the cathode is generally made of an active metal, and the luminous layer is generally made of an organic light-emitting material. The organic light-emitting material and the cathode in the OLED device are particularly sensitive to water vapor and oxygen, so water vapor and oxygen blocking requirements of the OLED device are relatively high. For example, suppose the service life of the OLED device is 10,000 hours, and the permeability of the water vapor and the permeability of the oxygen through OLED device encapsulation are calculated on the basis of minimums of water vapor quantity and oxygen quantity required for failure of low work functions (e.g. a work function of magnesium and a work function of calcium), and it is obtained that the water vapor permeability of a material for OLED device encapsulation is required to be less than $10^{-6}$ g/m$^2$/day, and the oxygen permeability is required to be less than $10^{-5}$-$10^{-3}$ cm$^3$/m$^2$/day.

The OLED device generally adopts a plastic substrate as a flexible substrate, and as the plastic substrate has relatively high water vapor and oxygen (hereinafter simply referred to as water oxygen) permeability, a barrier film needs to be manufactured in the flexible substrate to prevent the permeation of water oxygen. At present, the barrier film is generally formed by means of depositing a silicon nitride material (SiNx) and a silicon oxide material (SiOx) in the flexible substrate; because SiNx and SiOx are both inorganic materials, cracks are easily produced in the bending process; moreover, to prevent the water oxygen from permeating into the OLED device through pin holes, SiNx and SiOx need to have certain thicknesses to achieve the effect of blocking water and oxygen, whereas the probability of producing cracks is further increased due to the increase of thicknesses of SiNx and SiOx films. The barrier film cracks may lead to defects of the OLED device. Generally, when the OLED device has a defect, the defect of a thin film transistor (TFT) in the OLED device is easily determined from the change of electrical performance; whereas the defects caused by cracks of the barrier film in the OLED device need to be observed with a microscope, and observation by using the microscope has the problems that sample preparation is complex, a defect point is difficult to be found, a long time is consumed and the like, leading to not only low detection efficiency, but also low accuracy of detection result, and thus the process step causing the defect cannot be effectively controlled, thereby resulting in a relatively low rate of qualified product of the OLED device.

SUMMARY OF THE INVENTION

The technical problem to be solved by the present invention is to provide a flexible substrate, an OLED device including the flexible substrate and a defect detecting method for the same in view of above-mentioned shortcomings in the prior art. The flexible substrate and the OLED device have relatively high detection efficiency and can ensure the accuracy of the detection, so that the process step causing a defect can be effectively controlled, and thus the rate of qualified products of the flexible substrate and the OLED device are improved.

A technical solution adopted for solving the technical problem of the present invention is a flexible substrate comprising a bottom plate and a barrier layer arranged above the bottom plate, wherein the flexible substrate further includes a crack detection layer, which is arranged adjacent to the barrier layer; the crack detection layer produces a crack when the barrier layer produces a crack; and the color of the crack detection layer with a crack is different from that of the crack detection layer without a crack in a power-on state.

Preferably, the barrier layer includes a first barrier layer and a second barrier layer,
the crack detection layer is arranged adjacent to one of the first barrier layer and the second barrier layer; or the crack detection layer is arranged between the first barrier layer and the second barrier layer; and
the crack detection layer produces a crack when at least one of the first barrier layer and the second barrier layer produces a crack.

Preferably, the crack detection layer is made of an electrochromic material; the crack detection layer without a crack has a transparent color in the power-on state; and the crack detection layer with a crack has a nontransparent color in the power-on state.

Preferably, the electrochromic material is an inorganic electrochromic material or an organic electrochromic material.

Preferably, the inorganic electrochromic material includes tungsten trioxide, titanium dioxide or vanadium pentoxide, and the organic electrochromic material includes polythiophene and derivatives thereof, viologens, tetrathiafulvalene or metallic phthalocyanine compounds.

Preferably, the thickness of the crack detection layer is within the range of 500-3000 Å.

Preferably, the crack detection layer is formed by a chemical vapor deposition process.

Preferably, the bottom plate is a plastic substrate, and the first barrier layer and the second barrier layer are made of an inorganic material.

Preferably, the first barrier layer is closer to the bottom plate than the second barrier layer; the first barrier layer is made of a silicon nitride material; and the second barrier layer is made of a silicon oxide material.

Preferably, the first barrier layer is thinner than the second barrier layer; the thickness of the first barrier layer is within the range of 500-3000 Å; and the thickness of the second barrier layer is within the range of 1500-5000 Å.

An OLED device includes the above-mentioned flexible substrate.

The present invention further provides a defect detecting method for the above-mentioned flexible substrate, including:

powering on the crack detection layer in the flexible substrate;

detecting the color of the crack detection layer in the power-on state; and determining whether the flexible substrate has a defect in accordance with the color.

Preferably, in a case where the color is a nontransparent color, presence of a defect in the flexible substrate is determined; and in a case where the color is a transparent color, absence of a defect in the flexible substrate or presence of a defect in the flexible substrate however not caused by the barrier layers in the flexible substrate is determined.

The present invention further provides a defect detecting method for the above-mentioned OLED device, including:

powering on the crack detection layer in the OLED device;

detecting the color of the crack detection layer in the power-on state; and determining whether the OLED device has a defect in accordance with the color.

Preferably, in a case where the color is a nontransparent color, presence of a defect in the OLED device is determined; and in a case where the color is a transparent color, absence of a defect in the OLED device or presence of a defect in the OLED device however not caused by the barrier layers in the OLED device is determined.

The present invention has the following beneficial effects: by adding the crack detection layer made of the electrochromic material to the flexible substrate in the present invention, whether the barrier layer has a crack can be determined in accordance with the color of the crack detection layer in the power-on state, and compared with the way of detecting whether the barrier layer has a crack by observation with a magnifying glass in the prior art, it is easier to judge whether defects of the flexible substrate and the OLED device are caused by a crack in the barrier layer; meanwhile, the procedure of observing a sample with an amplifying glass is also omitted, and the shortcoming that a defect point is difficult to be found in sample preparation is overcome, and time is saved, so that relatively high detection efficiency is achieved, and the accuracy of the detection is ensured, and thus the defect producing process step can be effectively controlled, and the rate of qualified products of the flexible substrate and the OLED device are improved thereby.

REFERENCE NUMERALS

1—bottom plate; 2—first barrier layer; 3—crack detection layer; 4—second barrier layer; 5—display layer; 6—platform.

DETAILED DESCRIPTION OF THE EMBODIMENTS

To make those skilled in the art better understand the technical solutions of the present invention, a flexible substrate and an OLED device of the present invention will be further described in detail below in conjunction with the accompanying drawings and specific embodiments.

A flexible substrate includes a bottom plate and a barrier layer arranged above the bottom plate, wherein the flexible substrate further includes a crack detection layer, which is arranged adjacent to the barrier layer; the crack detection layer produces a crack when the barrier layer produces a crack; and the color of the crack detection layer with a crack is different from that of the crack detection layer without a crack in a power-on state.

An OLED device includes the above-mentioned flexible substrate.

Because the flexible substrate adopts the crack detection layer arranged adjacent to the barrier layer, whether the barrier layer in the flexible substrate has a crack may be conveniently detected by detecting the color of the crack detection layer in the power-on state, the detection is convenient and the result is accurate.

Correspondingly, the process steps which may produce defects in the manufacturing processes of the flexible substrate and the OLED device may be controlled, so that the yields of the flexible substrate and the OLED device are improved.

First Embodiment

This embodiment provides a flexible substrate; the flexible substrate includes a bottom plate and a barrier layer arranged above the bottom plate and further includes a crack detection layer, which is arranged adjacent to the barrier layer; the crack detection layer produces a crack when the barrier layer produces a crack; and the color of the crack detection layer with a crack is different from that of the crack detection layer without a crack in a power-on state.

Figure 1:
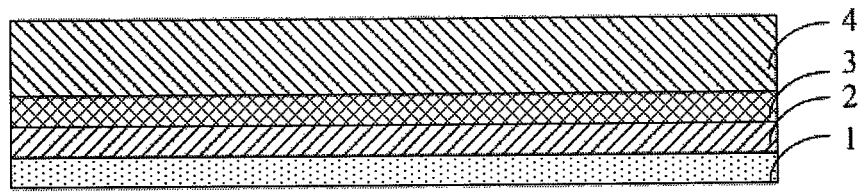
FIG. 1 is a structural schematic diagram of a flexible substrate in a first embodiment of the present invention.

As shown in FIG. 1, the barrier layer includes a first barrier layer 2 and a second barrier layer 4. The flexible substrate further includes a crack detection layer 3, and in this embodiment, the crack detection layer 3 is arranged between the first barrier layer 2 and the second barrier layer 4. Due to the particularity of the material (see the following description) forming the crack detection layer 3, when the first barrier layer 2 and/or the second barrier layer 4 produce a crack, the crack detection layer 3 is broken to produce a crack. The color of the crack detection layer 3 with a crack is different from that of the crack detection layer 3 without a crack in a power-on state. Therefore, whether the crack detection layer 3 has a crack may be determined by detecting the color of the crack detection layer 3 in the power-on state, and then whether the first barrier layer 2 and/or the second barrier layer 4 have a crack is determined. When the crack detection layer 3 is powered on, the applied voltage is within the range of 1-5 V.

It should be understood that, in the present invention, when the crack detection layer 3 is powered on, a positive electrode and a negative electrode for powering on need to be arranged on two sides (e.g. two opposite sides) of the crack detection layer 3.

For example, the crack detection layer 3 is made of an electrochromic material, and in this case, the crack detection layer 3 without a crack has a transparent color in the power-on state, and the crack detection layer 3 with a crack has a nontransparent color in the power-on state. Electrochromism means a phenomenon that optical properties (reflectivity, transmittance, absorption and the like) of a material have stable and reversible color changes under the action of an external electric field, which is represented by reversible changes of color and transparency in appearance. The electrochromic material has electrochromic performance such as good ion and electron conductivity, relatively high contrast, color change efficiency, cycle period, write-erase efficiency and the like.

Preferably, the electrochromic material includes an inorganic electrochromic material and an organic electrochromic material. Further preferably, the inorganic electrochromic material includes tungsten trioxide ($WO_3$), titanium dioxide ($TiO_2$) or vanadium pentoxide ($V_2O_5$), and the organic electrochromic material includes polythiophene and derivatives thereof, viologens, tetrathiafulvalene or metallic phthalocyanine compounds. The thickness of the crack detection layer 3 may be within the range of 500-3000 Å.

In this embodiment, the bottom plate 1 is generally a plastic substrate, and the first barrier layer 2 and the second barrier layer 4 are made of an inorganic material. In this case, the first barrier layer 2 is made of a silicon nitride material SiNx to achieve a relatively good water and oxygen blocking effect; and the second barrier layer 4 is made of a silicon oxide material SiOx, so that the flexible substrate obtains a relatively good balance stress. To ensure the relatively good water and oxygen blocking effect and the structure of the flexible substrate, the first barrier layer 2 made of the silicon nitride material SiNx is closer to the bottom plate 1 than the second barrier layer 4 made of the silicon oxide material SiOx; meanwhile, the first barrier layer 2 is thinner than the second barrier layer 4, for example, the thickness of the first barrier layer 2 made of the silicon nitride material SiNx is within the range of 500-3000 Å, and the thickness of the second barrier layer 4 made of the silicon oxide material SiOx is within the range of 1500-5000 Å.

As materials with similar properties have better compatibility, and since both the first barrier layer 2 and the second barrier layer 4 are made of an inorganic material in this embodiment, the crack detection layer 3 is preferably made of an inorganic material, so that the crack detection layer 3 has better compatibility with the first barrier layer 2 and the second barrier layer 4.

Figure 1A:
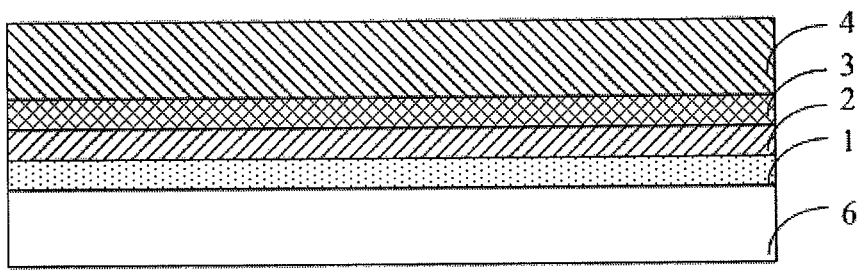
FIG. 1A is a manufacturing schematic diagram of the flexible substrate in the first embodiment of the present invention.

As shown in FIG. 1A, during manufacturing of the flexible substrate of this embodiment, firstly the bottom plate 1 is placed on a platform 6, and then the first barrier layer 2, the crack detection layer 3 and the second barrier layer 4 are sequentially formed on the bottom plate 1. In this case, the first barrier layer 2, the crack detection layer 3 and the second barrier layer 4 are all formed by chemical vapor deposition (CVD), to obtain a more uniform layered structure. After the crack detection layer 3 is formed, power-on detection may be immediately performed on the crack detection layer 3, to ensure that the crack detection layer 3 itself does not have a crack, and of course, whether the formed first barrier layer 2 has a crack may also be determined at the same time, to timely improve the manufacturing process, so that the rate of qualified products of the flexible substrate is improved.

In this embodiment, by adding the crack detection layer 3 made of the electrochromic material between the first barrier layer 2 and the second barrier layer 4, due to the particularity of the material for forming the crack detection layer 3, when any barrier layer (only the first barrier layer 2, or only the second barrier layer 4, or each of the first barrier layer 2 and the second barrier layer 4) has a crack, the crack detection layer 3 is broken to produce a crack, and thus by detecting the color of the crack detection layer 3 in the power-on state, whether the first barrier layer 2 and/or the second barrier layer 4 produce a crack when peeling off or flexible bending or other operation is carried out on the flexible substrate may be judged.

Figure 1B:
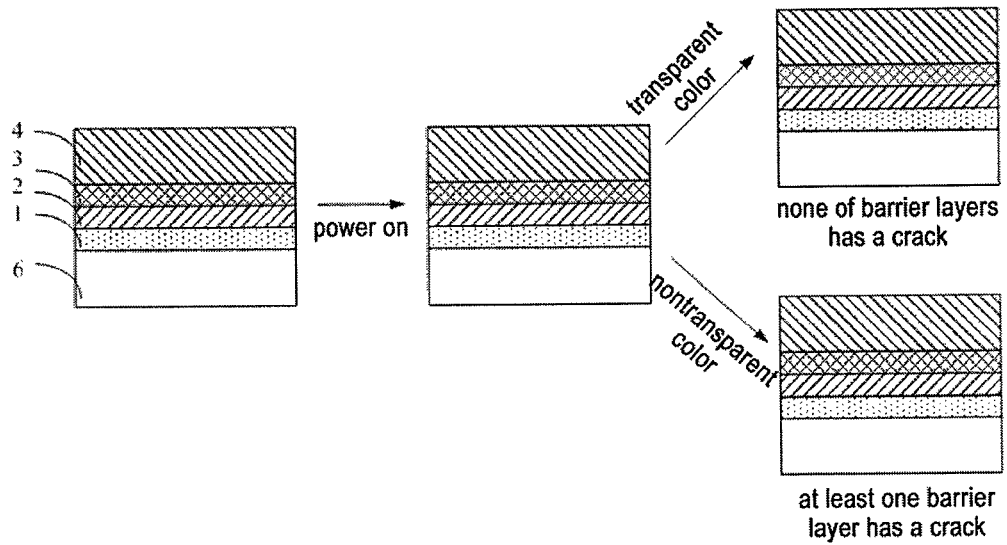
FIG. 1B is a detection schematic diagram of judging whether the defect of the flexible substrate is caused by a crack of a barrier layer in the first embodiment of the present invention.

As shown in FIG. 1B, when the flexible substrate is detected, in a case where the color of the crack detection layer 3 in the power-on state is a transparent color, it indicates that none of the first barrier layer 2 made of the silicon nitride material SiNx and the second barrier layer 4 made of the silicon oxide material SiOx has a crack; and in a case where the color of the crack detection layer 3 in the power-on state is a nontransparent color, it indicates that at least one of the first barrier layer 2 made of the silicon nitride material SiNx and the second barrier layer 4 made of the silicon oxide material SiOx produces a crack.

In a case where the color of the crack detection layer 3 of the flexible substrate in the power-on state is a nontransparent color (that is, at least one of the first barrier layer 2 and the second barrier layer 4 has a crack) as detected, parameters of manufacturing equipment in the manufacturing process of the barrier layers can be appropriately adjusted, to avoid continuously producing flexible substrates with defects, so as to improve the rate of qualified products of the flexible substrate.

Second Embodiment

This embodiment provides a flexible substrate, and differs from the first embodiment in that the crack detection layer 3 in the flexible substrate of this embodiment is only adjacent to the first barrier layer 2.

Figure 2:
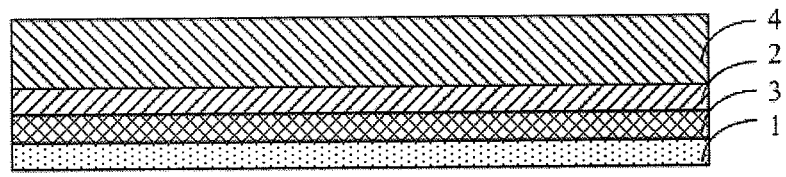
FIG. 2 is a structural schematic diagram of a flexible substrate in a second embodiment of the present invention.

As shown in FIG. 2, the first barrier layer 2 is closer to the bottom plate 1 than the second barrier layer 4, and the crack detection layer 3 is arranged adjacent to the first barrier layer 2 and the bottom plate 1, namely the crack detection layer 3 is arranged between the bottom plate 1 and the first barrier layer 2.

Other structures of the flexible substrate in this embodiment are the same as those in the first embodiment, and the method of detecting whether the barrier layers in the flexible substrate have cracks through the crack detection layer is the same as that of the first embodiment, which are not redundantly described herein.

Third Embodiment

This embodiment provides a flexible substrate, and differs from the first embodiment in that the crack detection layer 3 in the flexible substrate of this embodiment is only adjacent to the second barrier layer 4.

Figure 3:
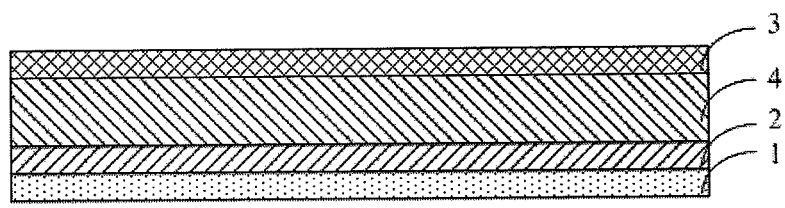
FIG. 3 is a structural schematic diagram of a flexible substrate in a third embodiment of the present invention.

As shown in FIG. 3, the first barrier layer 2 is closer to the bottom plate 1 than the second barrier layer 4, and the crack detection layer 3 is arranged only adjacent to the second barrier layer 4, namely the crack detection layer 3 is arranged on one side of the second barrier layer 4 away from the bottom plate 1.

Other structures of the flexible substrate in this embodiment are the same as those in the first embodiment, and the method of detecting whether the barrier layers in the flexible substrate have cracks through the crack detection layer is the same as that of the first embodiment, which are not redundantly described herein.

It could be seen from the first through third embodiments that the crack detection layer may be arranged on either side of the first barrier layer and the second barrier layer, as long as it ensures that the crack detection layer is arranged adjacent to at least one of the first barrier layer and the second barrier layer, whereas the specific position of the crack detection layer is not limited. Therefore, in practical application, the position of the crack detection layer may be determined according to the specific structure of the flexible substrate, that is, the location of the crack detection layer is flexible and convenient.

Fourth Embodiment

This embodiment provides an OLED device adopting any of the flexible substrates provided by the first through third embodiments.

Figure 4:
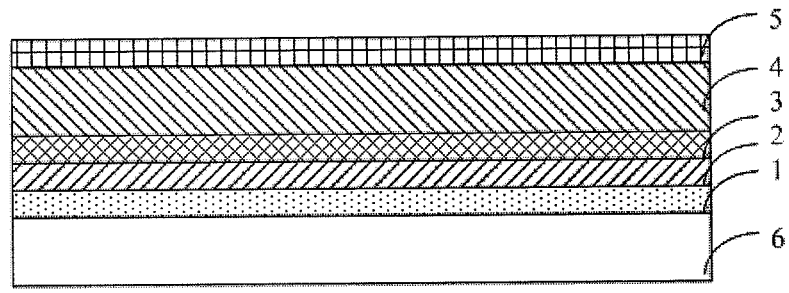
FIG. 4 is a structural schematic diagram of an OLED device in a fourth embodiment of the present invention.

As shown in FIG. 4, a display layer 5 is arranged above the flexible substrate, and the display layer 5 includes thin film transistors (TFTs for short) and organic light-emitting diodes (OLEDs). Taking an OLED device to be formed by adopting the structure of the flexible substrate in the first embodiment as an example, during manufacturing of the OLED device of this embodiment, firstly the bottom plate 1 is placed on the platform 6, then the first barrier layer 2, the crack detection layer 3 and the second barrier layer 4 are sequentially formed on the bottom plate 1, and then TFTs and OLEDs are formed.

Taking an OLED device to be formed by adopting the structure of the flexible substrate in the first embodiment as an example, whether the OLED device has a defect and/or the reason of the defect in the following three cases are detected:

case I: the OLED device has a defect, and whether the defect is caused by a crack of a barrier layer is to be detected;

case II: the OLED device before peeling off is normal, and the peeled-off OLED device has a defect, and whether the defect is caused by a crack of a barrier layer is to be detected;

case III: the peeled-off OLED device is normal, and the bent OLED device has a defect, and whether the defect is caused by a crack of a barrier layer is to be detected.

Figure 4A:
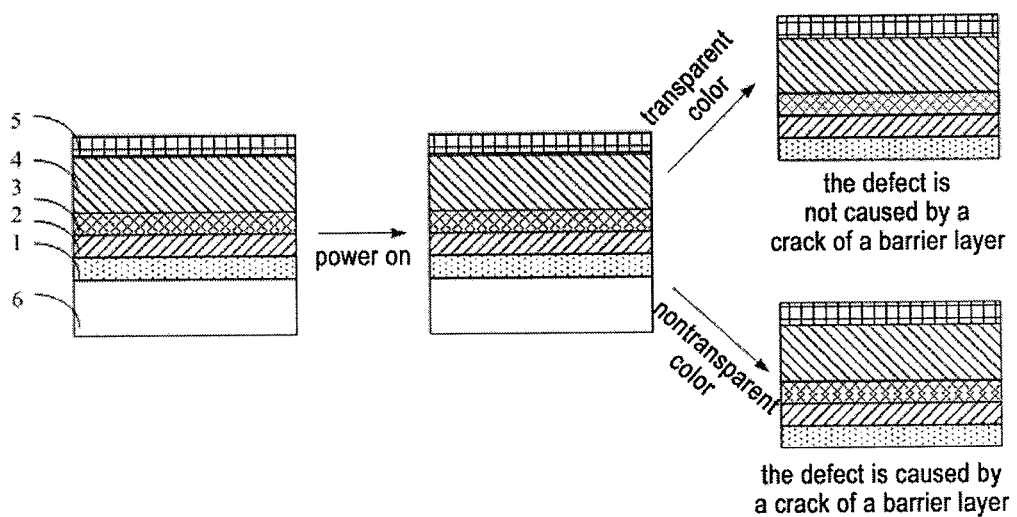
FIG. 4A is a detection schematic diagram of judging whether the defect of the OLED device is caused by a crack of a barrier layer in the fourth embodiment of the present invention.

In case I, when the OLED device has a defect, whether the defect is caused by a crack of a barrier layer is to be detected. As shown in FIG. 4A, before the OLED device is peeled off from the platform 6, the crack detection layer 3 is powered on, and the color of the crack detection layer 3 in the power-on state is observed; if the color of the crack detection layer 3 in the power-on state is a transparent color, it indicates that the defect of the OLED device is not caused by cracks of the first barrier layer 2 and/or the second barrier layer 4, but may be caused by defects of TFTs or other reasons; and if the color of the crack detection layer 3 in the power-on state is a nontransparent color, the defect of the OLED device is caused by a crack of at least one of the first barrier layer 2 and the second barrier layer 4.

Whether the defect of the OLED device is caused by a crack of a barrier layer may be determined through the above detection, so that the range of the reasons for defects of a batch of OLED devices may be reduced and the detection efficiency may be improved.

Figure 4B:
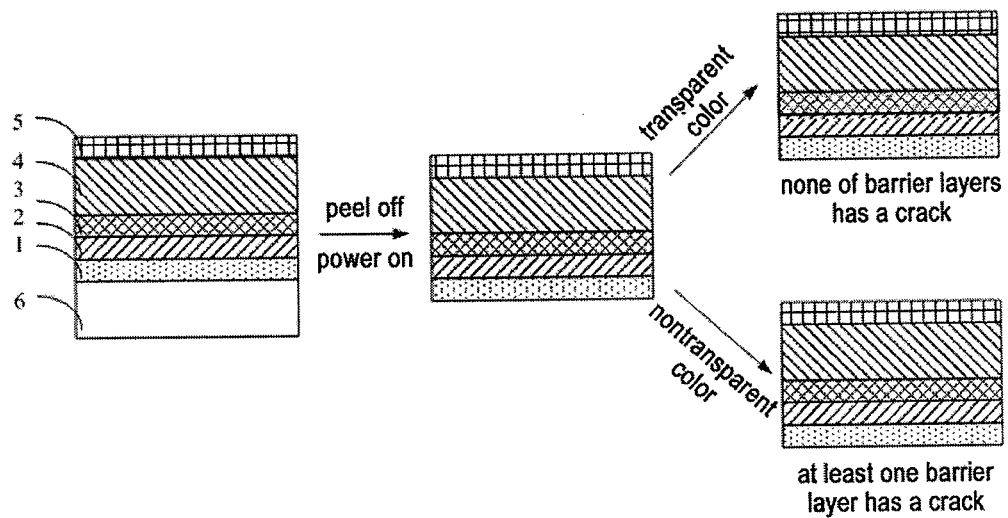
FIG. 4B is a detection schematic diagram of judging whether the OLED device produces a crack due to peeling off in the fourth embodiment of the present invention.

In case II, the OLED device before peeling off is normal, and the peeled-off OLED device has a defect, and whether the defect is caused by a crack of a barrier layer is to be detected. As shown in FIG. 4B, firstly, before the OLED device is peeled off from the platform 6, the crack detection layer 3 is powered on, and whether the color of the crack detection layer 3 in the power-on state is a transparent color or a nontransparent color is observed. If the color of the crack detection layer 3 in the power-on state is a transparent color, it indicates that none of the first barrier layer 2 and the second barrier layer 4 has a crack; in this case, the OLED device is peeled off from the platform 6; and then, the crack detection layer 3 of the peeled-off OLED device is powered on again, and whether the color of the crack detection layer 3 in the power-on state is a transparent color or a nontransparent color is observed, and if the color is a transparent color, it indicates that none of the first barrier layer 2 and the second barrier layer 4 has a crack, and if the color is a nontransparent color, it indicates that at least one of the first barrier layer 2 and the second bather layer 4 has a crack.

Whether the barrier layers produce cracks in the peeling-off process to cause the defect of the OLED device may be determined through the above detection: in a case where it is detected that there is a relatively large defect rate for the OLED device due to the peeling-off process, the peeling-off process may be appropriately improved, to reduce the defect rate of the OLED device, so as to reduce the loss caused by the peeling-off process.

Figure 4C:
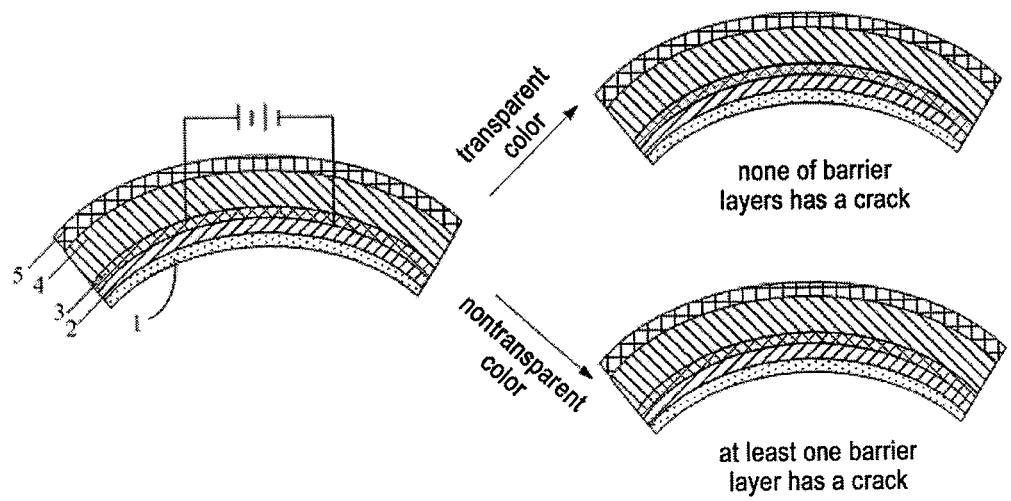
FIG. 4C is a detection schematic diagram of judging whether the OLED device produces a crack due to bending in the fourth embodiment of the present invention.

In case III, the peeled-off OLED device is normal, and the bent OLED device has a defect, and whether the defect is caused by a crack of a bather layer is to be detected. As shown in FIG. 4C, firstly, before the OLED device is bent, the crack detection layer 3 is powered on, and whether the color of the crack detection layer 3 in the power-on state is a transparent color or a nontransparent color is observed. If the color of the crack detection layer 3 in the power-on state is a transparent color, it indicates that none of the first barrier layer 2 and the second barrier layer 4 has a crack; in this case, the OLED device is bent by using a bending jig; and then, the crack detection layer 3 of the bent OLED device is powered on again, and whether the color of the crack detection layer 3 in the power-on state is a transparent color or a nontransparent color is observed. If the color of the crack detection layer 3 in the power-on state is a transparent color, it indicates that none of the first barrier layer 2 and the second barrier layer 4 has a crack; and if the color of the crack detection layer 3 in the power-on state is a nontransparent color, it indicates that at least one of the first barrier layer 2 and the second barrier layer 4 has a crack.

Whether the barrier layers produce cracks in the bending process to cause the defect of the OLED device may be determined through the above detection.

Through the detection in the above three cases, the defect reason of the OLED device may be gradually determined, and the defect producing process step of the OLED device may be determined, so that the defect producing process step of the OLED device is controllable, increasing the detection efficiency of the OLED device, and the accuracy of the detection is ensured.

The OLED device in this embodiment as a display device may be any product or component with display function, such as electronic paper, an OLED panel, a mobile phone, a tablet computer, a display, a notebook computer, a digital photo frame, a navigator and the like.

Because the OLED device in this embodiment adopts the flexible substrate with relatively high yield, the rate of qualified products of the OLED device is correspondingly improved, and the display effect is improved.

By adding the crack detection layer made of the electrochromic material to the flexible substrate in the present invention, whether the barrier layer has a crack may be determined in accordance with the color of the crack detection layer in the power-on state, and whether the barrier layer in the flexible substrate or the OLED device has a crack may be detected in any convenient process step, and compared with the way of detecting whether the barrier layer has a crack by observation with a magnifying glass in the prior art, it is easier to judge whether the defect of the OLED device is caused by a crack of the barrier layer; meanwhile, the procedure of observing a sample with the amplifying glass is also omitted, and the shortcoming that a defect point is difficult to be found is overcome, and time is saved, so that relatively high detection efficiency is achieved, and the accuracy of the detection is ensured, and thus the defect producing process step may be effectively controlled, and the rate of qualified products of the flexible substrate and the OLED device are improved.

It should be understood that although description is made in the above embodiments by taking an example that the crack detection layer 3 is made of the electrochromic material (including an inorganic electrochromic material and an organic electrochromic material), so that the crack detection layer 3 without a crack has a transparent color in the power-on state and the crack detection layer 3 with a crack has a nontransparent color in the power-on state, the present invention is not limited thereto. As long as the crack detection layer 3 without a crack produces a crack when at least one of the first barrier layer 2 and the second barrier layer 4 produces a crack and the color of the crack detection layer 3 with a crack is different from that of the crack detection layer 3 without a crack in the power-on state, the material for the crack detection layer 3 of the present invention is not limited to the electrochromic material.

It should be understood that the above embodiments are merely exemplary embodiments adopted for describing the principle of the present invention, but the present invention is not limited thereto. Various modifications and improvements may be made for those skilled in the art without departing from the spirit and essence of the present invention, and these modifications and improvements also fall into the protection scope of the present invention.

The invention claimed is:

1. A flexible substrate, comprising a bottom plate and a barrier layer arranged above the bottom plate, wherein the flexible substrate further comprises a crack detection layer, which is arranged adjacent to the barrier layer; the crack detection layer produces a crack when the barrier layer produces a crack; and the crack detection layer with a crack has a color different from that of the crack detection layer without a crack in a power-on state.

2. The flexible substrate of claim 1, wherein,
the barrier layer comprises a first barrier layer and a second barrier layer,
the crack detection layer is arranged adjacent to one of the first barrier layer and the second barrier layer; or the crack detection layer is arranged between the first barrier layer and the second barrier layer; and
the crack detection layer produces a crack when at least one of the first barrier layer and the second barrier layer produces a crack.

3. The flexible substrate of claim 1, wherein the crack detection layer is made of an electrochromic material, and the crack detection layer without a crack has a transparent color in the power-on state, and the crack detection layer with a crack has a nontransparent color in the power-on state.

4. The flexible substrate of claim 2, wherein the crack detection layer is made of an electrochromic material, and the crack detection layer without a crack has a transparent color in the power-on state, and the crack detection layer with a crack has a nontransparent color in the power-on state.

5. The flexible substrate of claim 3, wherein the electrochromic material is an inorganic electrochromic material or an organic electrochromic material.

6. The flexible substrate of claim 4, wherein the electrochromic material is an inorganic electrochromic material or an organic electrochromic material.

7. The flexible substrate of claim 5, wherein the inorganic electrochromic material comprises tungsten trioxide, titanium dioxide or vanadium pentoxide, and the organic electrochromic material comprises polythiophene and derivatives thereof, viologens, tetrathiafulvalene or metallic phthalocyanine compounds.

8. The flexible substrate of claim 6, wherein the inorganic electrochromic material comprises tungsten trioxide, titanium dioxide or vanadium pentoxide, and the organic electrochromic material comprises polythiophene and derivatives thereof, viologens, tetrathiafulvalene or metallic phthalocyanine compounds.

9. The flexible substrate of claim 1, wherein the crack detection layer has a thickness within a range of 500-3000 Å.

10. The flexible substrate of claim 1, wherein the crack detection layer is formed by a chemical vapor deposition process.

11. The flexible substrate of claim 2, wherein the bottom plate is a plastic substrate, and the first barrier layer and the second barrier layer are made of an inorganic material.

12. The flexible substrate of claim 2, wherein the first barrier layer is closer to the bottom plate than the second barrier layer; the first barrier layer is made of a silicon nitride material; and the second barrier layer is made of a silicon oxide material.

13. The flexible substrate of claim 11, wherein the first barrier layer is closer to the bottom plate than the second barrier layer; the first barrier layer is made of a silicon nitride material; and the second barrier layer is made of a silicon oxide material.

14. The flexible substrate of claim 2, wherein the first barrier layer is thinner than the second barrier layer; the first barrier layer has a thickness within a range of 500-3000 Å; and the second barrier layer has a thickness within a range of 1500-5000 Å.

15. The flexible substrate of claim 11, wherein the first barrier layer is thinner than the second barrier layer; the first barrier layer has a thickness within a range of 500-3000 Å; and the second barrier layer has a thickness within a range of 1500-5000 Å.

16. The flexible substrate of claim 12, wherein the first barrier layer is thinner than the second barrier layer; the first barrier layer has a thickness within a range of 500-3000 Å; and the second barrier layer has a thickness within a range of 1500-5000 Å.

17. The flexible substrate of claim 13, wherein the first barrier layer is thinner than the second barrier layer; the first barrier layer has a thickness within a range of 500-3000 Å; and the second barrier layer has a thickness within a range of 1500-5000 Å.

18. An OLED device, comprising the flexible substrate of claim 1.

19. A defect detecting method for the flexible substrate of claim 1, comprising:
    powering on the crack detection layer in the flexible substrate;
    detecting the color of the crack detection layer in the power-on state; and
    determining whether the flexible substrate has a defect in accordance with the color.

20. The defect detecting method of claim 19, wherein:
    in a case where the color is a nontransparent color, presence of a defect in the flexible substrate is determined; and in a case where the color is a transparent color, absence of a defect in the flexible substrate or presence of a defect in the flexible substrate however not caused by the barrier layers in the flexible substrate is determined.

* * * * *